United States Patent [19]

Kobori et al.

[11] Patent Number: 4,605,901
[45] Date of Patent: Aug. 12, 1986

[54] FREQUENCY-VOLTAGE CONVERTER

[75] Inventors: Yasunori Kobori; Isao Fukushima; Hideo Nishijima; Yoshinori Masuda, all of Katsuta; Norihisa Yamamoto, Gunma, all of Japan

[73] Assignees: Hitachi, Ltd.; Hitachi Microcomputer & Engineering, Ltd., both of Tokyo, Japan

[21] Appl. No.: 486,827

[22] Filed: Apr. 20, 1983

[30] Foreign Application Priority Data

Apr. 21, 1982 [JP] Japan .................................. 57-65280

[51] Int. Cl.⁴ ............................................. H03K 9/06
[52] U.S. Cl. .................................... 328/140; 307/519; 307/352
[58] Field of Search ...................... 307/219.1, 519, 228, 307/352, 553, 359; 328/140, 141, 151, 15; 363/8

[56] References Cited

U.S. PATENT DOCUMENTS

| | | |
|---|---|---|
| 3,676,697 | 7/1972 | Davenport .......................... 307/228 |
| 3,740,633 | 6/1973 | Buttafava ........................... 307/519 |
| 4,214,299 | 7/1980 | Nakagaki et al. .................... 307/519 |
| 4,375,599 | 3/1983 | Bleckman et al. .................... 307/519 |
| 4,446,439 | 5/1984 | Mizumoto et al. ................... 307/519 |

Primary Examiner—Stanley D. Miller
Assistant Examiner—Timothy P. Callahan
Attorney, Agent, or Firm—Antonelli, Terry & Wands

[57] ABSTRACT

A frequency-voltage converter comprising a feedback frequency generating means associated with controlled means, a saw-tooth wave generating means, a current source for the saw-tooth wave, pulse generating means and sample-and-hold means, the frequency-voltage converter being characterized by further provision of supply voltage switching means for changing the feedback frequency of the controlled means by changing the voltage to be supplied to the current source to change the current from the current source and to thereby the slope of the saw-tooth wave from the saw-tooth wave generating means.

6 Claims, 4 Drawing Figures

FREQUENCY-VOLTAGE CONVERTER

This invention relates to an apparatus for changing the speed of a motor by means of a feedback loop, and more particularly to a frequency-voltage converter which is suitable for completing the adjustment of plural different speeds by a single operation.

In the conventional speed control system having a feedback loop, plural different speeds to be controlled require the same number of adjustments as the number of the plural different speeds. For example, in a VTR, when 2-hour, 4-hour and 6-hour record modes are respectively selected, the speed of the video tape must be changed to three different values, thereby requiring by three different adjustments.

This will be described with reference to FIGS. 1 and 2.

In FIG. 1, a video tape 1 is driven by a capstan motor 2 (for example, a direct drive motor). The motor 2 is provided with a frequency generator 3 (hereinafter, abbreviated FG), the output from which is fed to a control IC4 via a terminal T4 as an FG signal. The control IC4 includes an FG amplifier 5, a pulse generating circuit 6, a current source 7, a saw-tooth wave generator 8 (SAW generator circuit), a sample-and-hold circuit 9 and an output amplifier 10. The output of the control IC4 is connected to motor drive means 11 so as to drive the capstan motor 2 to rotate. The terminal of the current source 7 is connected to variable resistors 12, 13 and 14 and fixed resistors 15, 16 and 17. The other end of the resistor 15 is grounded, and the other ends of the resistors 16 and 17 are connected to the collectors of transistors 18 and 19. These resistors 12, 13, 14, 15, 16 and 17 and transistors 18 and 19 constitute a supply current changing circuit CC. In addition, the saw-tooth wave generator 8 and sample-and-hold circuit 9 are connected to capacitors 20 and 21, respectively.

The operation of the apparatus of FIG. 1 in the 6-hour record mode will be described with reference to FIG. 2.

In the 6-hour record mode, the switching transistors 18 and 19 are turned off, and the resistors 13, 14, 16 and 17 do not affect the characteristics of the current source 7. Thus, a minimum amount of output current $I_o$ is supplied from the current source 7 to the saw-tooth wave generating circuit 8. The signal from the FG is amplified by the FG amplifier 5 into signal $S_{FG}$ shown in FIG. 2(A).

In the pulse generating circuit, the signal $S_{FG}$ is amplitude-limited to a substantially complete rectangular wave $S_R$ shown in FIG. 2(B), which is then converted to a trapezoidal wave $S_T$ shown in FIG. 2(C), and this wave $S_T$ is full-wave rectified into a rectified wave $S_{TR}$ shown in FIG. 2(D), which is then applied to a dead zone circuit, such as a typical Schmitt trigger circuit, thereby passes when it is at a threshold voltage $V_1$ or above as shown in FIG. 2(D), into a train of pulses P having a pulse width $\tau$ shown in FIG. 2(E). Then, a sampling pulse SP shown in FIG. 2(F), generated at the trailing edge of the pulse P is applied to the sample-and-hold circuit 9. Immediately after the sampling pulse SP is applied to the circuit 9, a reset pulse RP is applied to the saw-tooth wave generating circuit 8. Therefore, the capacitor 20 is charged at the trailing edge of the reset pulse RP, and discharged at the leading edge of the next reset pulse RP to ground level, so that the SAW generator 8 produces a saw-tooth wave SAW as shown in FIG. 2(H). Thus, the sampled and held voltage, or the voltage across the capacitor 21 becomes a voltage $V_{SH}$ as shown in FIG. 2(I), which is sufficiently amplified by the output amplifier 10 for comparing with a reference voltage ER and amplifying the voltage error, and by the motor drive means 11 to substantially power source voltage $V_{cc}/2$.

Description will be made of the case in which the apparatus of FIG. 1 is switched from the 6-hour record mode to the 2-hour record mode by changing the speed of the capstan motor 2. When the 2-hour record mode is selected, the switching transistors 18 and 19 are both turned on and thereby the output current $I_o$ from the current source 7 is increased to about three times that in the 6-hour record mode. At this time, the slope of the saw-tooth wave SAW becomes about three times larger than in the 6-hour record mode. However, just after the output current $I_o$ is increased to about three times that in the 6-hour record mode, the speed of the capstan motor 2 is still unchanged and thus the period of the pulse remains $T_{06}/2$ with the period of charging of the capacitor 20 not being changed. Therefore, the crest value $V_{SAW'}$ of the saw-tooth wave is considerably larger than $V_{SAW}$ in the 6-hour record mode, as shown in FIG. 2(H), and hence the smoothed voltage $V_{SH'}$ (see FIG. 2(I)) becomes at a high level. The voltage $V_{SH'}$ of high level is compared with the reference voltage $E_R$ in the output amplifier 10 and the difference therebetween, or error is amplified to control the motor drive means 11 to increase the speed of the capstan motor 2. If the speed of the capstan motor 2 is increased, the period of the pulse is shorter than $T_{06}/2$ and thus the period of charging the capacitor 20 becomes short with the result that the $V_{SAW'}$ and $V_{SH'}$ are decreased. The decreased $V_{SH}$ is compared with the reference voltage $E_R$ in the output amplifier 10, and the voltage error therebetween allows the capstan motor 2 to increase its speed. In this way, the above operations are repeated until the speed of the capstan motor 2 reaches a desired value (a proper value for the 2-hour record mode). If the speed of the capstan motor 2 is increased to a value larger than the desired value, the period of the pulse P is shorter than that necessary for the 2-hour record mode. Consequently, the voltage $V_{SAW}$ is decreased to a level lower than a value necessary for the 2-hour record mode and the voltage $V_{SH}$ is also lower than the reference voltage $E_R$. The voltage error between the voltage $V_{SH}$ and the reference voltage $E_R$ is amplified by the output amplifier 10 and applied to the motor drive means 11 by which the speed of the capstan motor 2 is decreased. In this way, the speed of the capstan motor 2 is feedback-controlled to maintain a desired value.

Thus, in the VTR, adjustment of the speed of the video tape to three values for 2-, 4- and 6-hour record modes needs three resistance value adjustment operations. In order to change the speed of the capstan motor 2 by changing the current from the current source 7 in FIG. 1, it is necessary to switch the resistance values of resistors 12, 13, 14, 15, 16 and 17 connected in the supply current switching circuit CC. For the adjustment of the video tape speed to a value necessary for the 6-hour record mode, the variable resistor 12 is adjusted so that the sum of the resistance values (represented by (R12+R15)) of the resistors 15 and 12 reaches a proper value because, even if the fixed resistor 15 of a predetermined value can be produced with very high precision variations in the characteristics of the transistors used in the current source 7 must exist, and therefore the variable resistor 12 must be connected to the resistor 15 so that the resultant value (R12+R15) is changed to a proper value by adjusting the resistance of the variable resistor 12. The resistance values of the resistors 15, 16 and 17 also can be adjusted accurately by trimming or the like; however, variations will remain in the characteristics of the transistors used in the current source 7. The resistance values of the resistors 13, 14, 16 and 17 must be adjusted to values necessary for each of the 4-hour and 2-hour modes in association with the resultant value (R12+R15) of the values of the resistors 12 and 15. This requires a number of adjustments which corresponds to the number of different speeds to be switched.

Moreover, the widths $t_{SP}$ and $t_R$ of the pulses SP and RP have the same value for the 2-hour and 6-hour record modes, so that it is difficult for the saw-tooth wave to reach the proper level of voltage $V_{SAW}$ with high precision.

Accordingly, it is an object of this invention to provide a frequency-voltage converter capable of completing adjustment of a number of control frequencies by a single operation.

The feature of this invention is that the current from the current source for a saw-tooth wave generating section incorporated in the frequency-voltage converter is changed by applying a correct voltage to the current source, so as to change the slope of the saw-tooth wave thereby changing the feedback pulse frequency of the controlled means. The voltage supplied to the current source can be changed accurately by changing the connecting relationship between the resistors in the supply voltage changing circuit and the fixed and variable resistors of the current source.

The invention will become more readily understood from the following exemplary description taken with the accompanying drawings, wherein.

Figure 1:
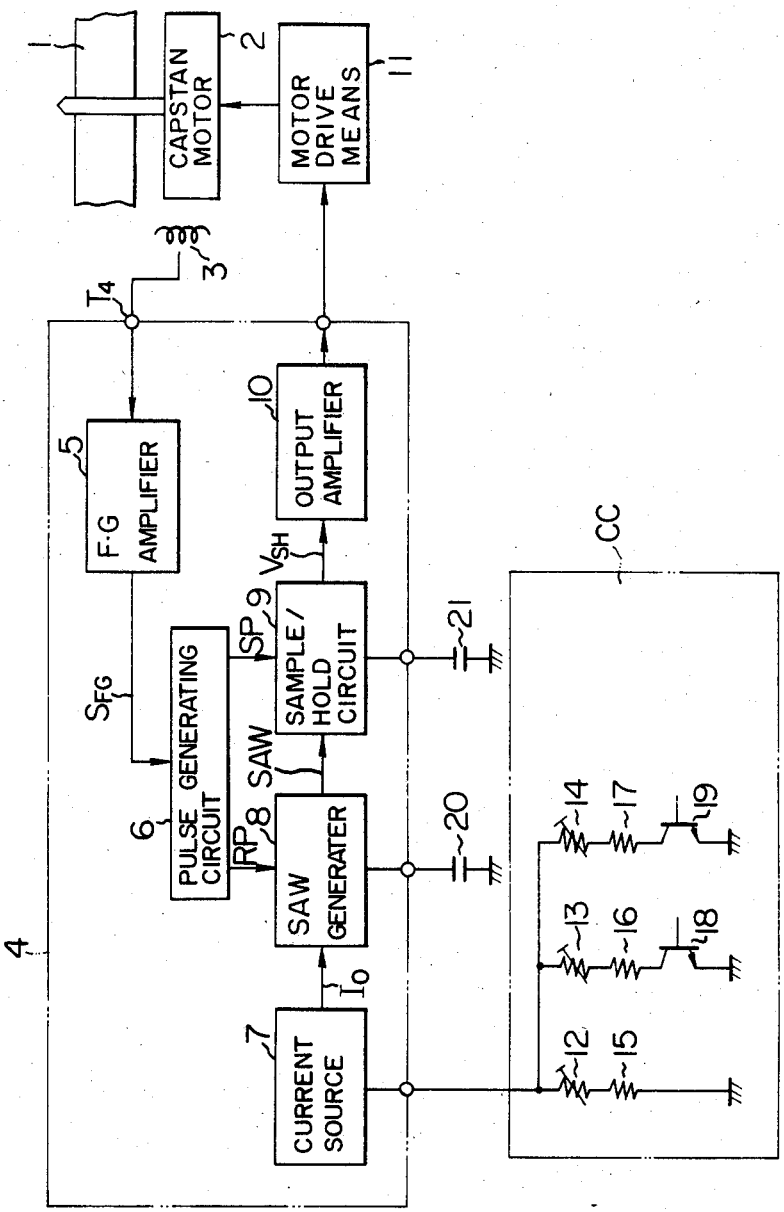
FIG. 1 is a block diagram of a conventional frequency-voltage converter.
Figure 2:
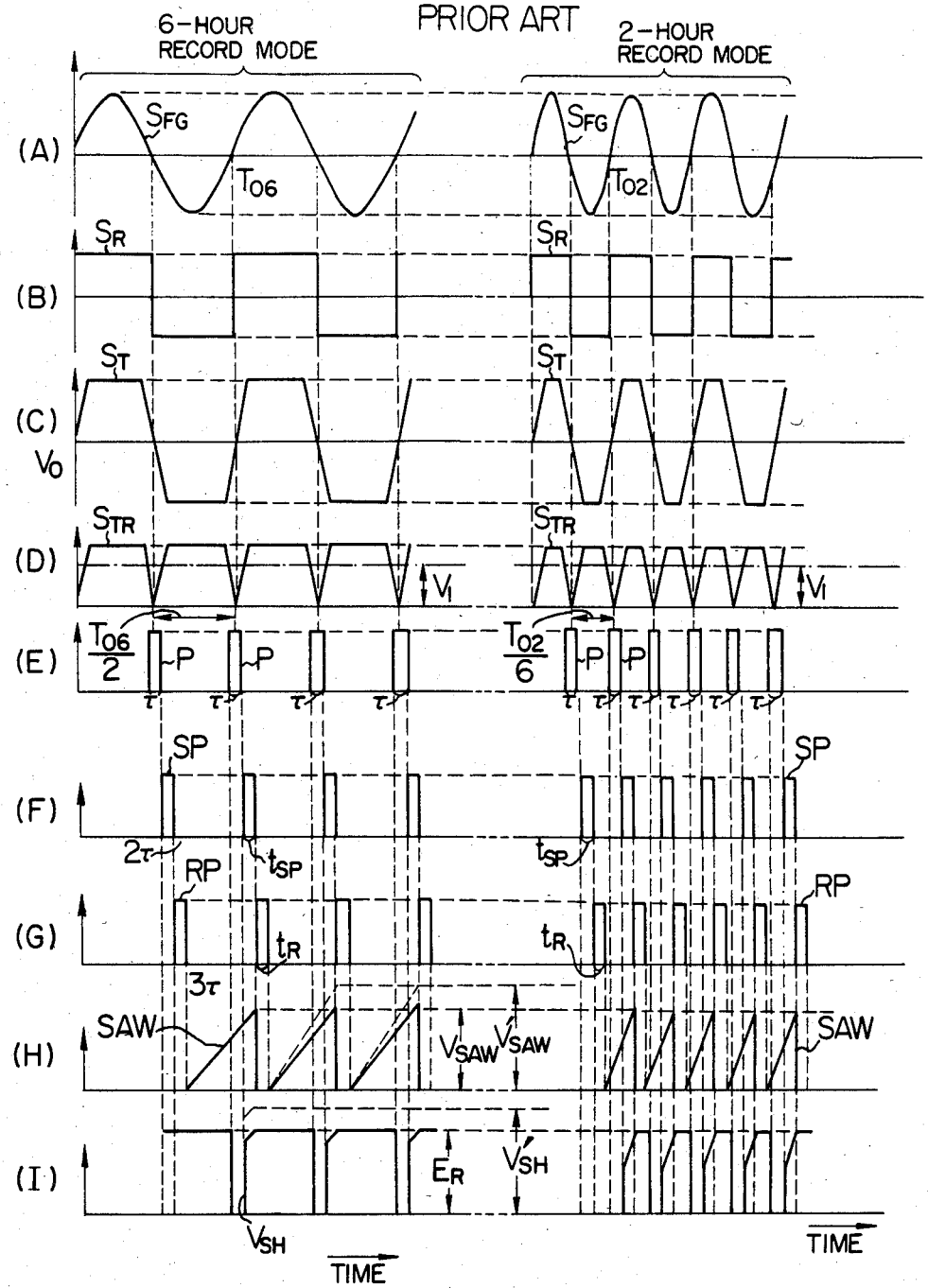
FIG. 2 is a waveform diagram useful for explaining the operation of the frequency-voltage converter of FIG. 1.
Figure 3:
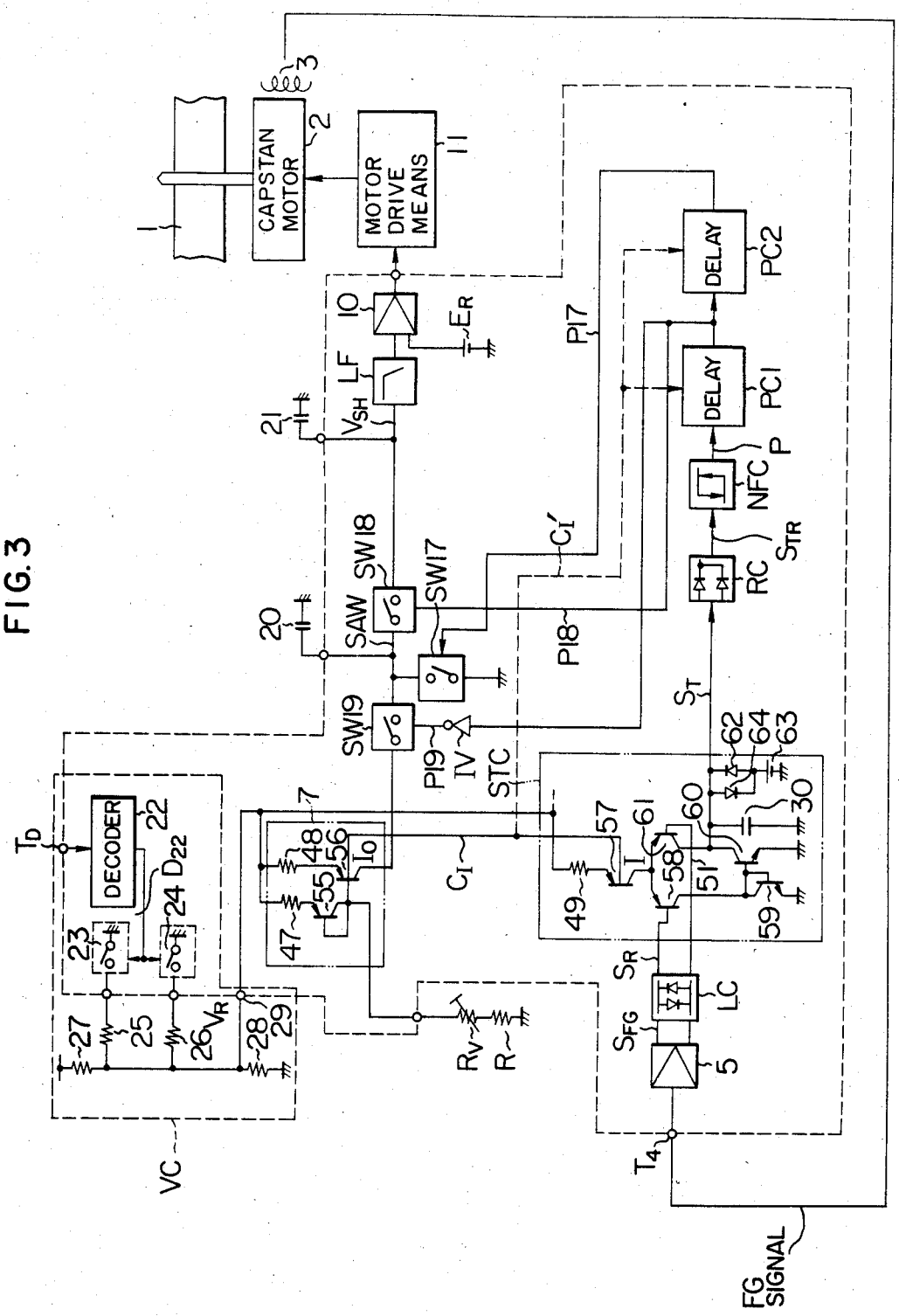
FIG. 3 is a circuit diagram of an embodiment of the frequency-voltage converter according to this invention.
Figure 4:
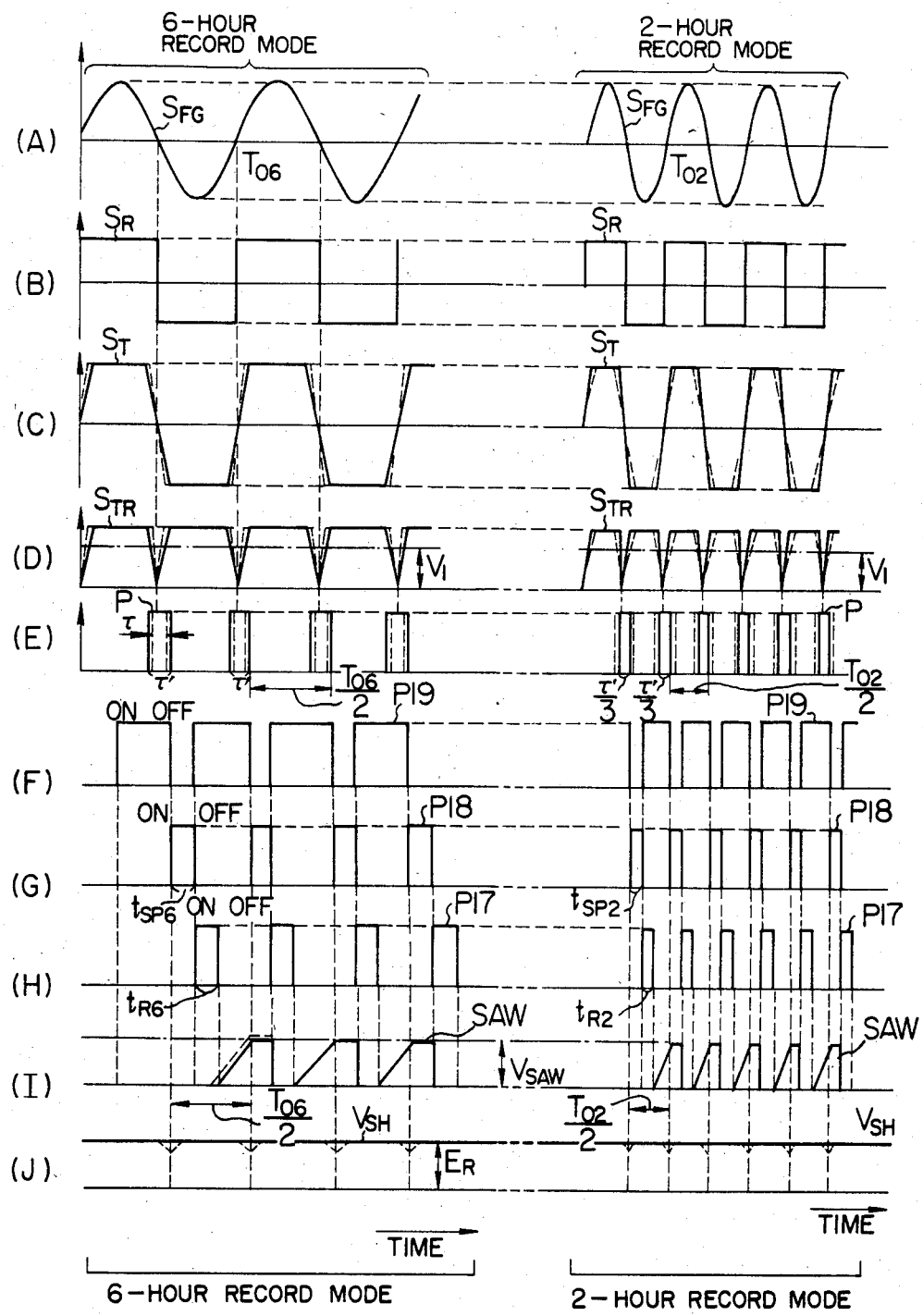
FIG. 4 is a waveform diagram useful for explaining the operation of the frequency-voltage converter of FIG. 3.

One embodiment of this invention will hereinafter be described with reference to FIGS. 3 and 4. In FIG. 3, like elements as those of FIG. 1 are identified by the same reference numerals. Referring to FIG. 3, there is shown a supply voltage change-over means VC which comprises a decoder 22, switches 23 and 24 (hereinafter, abbreviated SW 23, 24) that are made on and off by the output from the decoder 22, resistors 25 and 26 that are grounded or made in the open condition by the SWs 23 and 24, respectively, and resistors 27 and 28 connected to the other ends of the resistors 25 and 26, respectively, the one ends of the resistors 25 and 26 being connected to a current source 7 within an IC4. Thus, the supply voltage change-over means VC changes the voltage $V_R$ to be supplied to the current source 7, so as to control the output current $I_o$ from the current source 7.

The operation of the apparatus of FIG. 3 will be described below. The output signal FG from the frequency generator FG3 is applied through a terminal T4 to the control IC4 and amplified by the FG amplifier 5 into the signal $S_{FG}$ shown in FIG. 4(A). The signal $S_{FG}$ is limited in its amplitude by a limiter circuit LC so as to be shaped into substantially complete rectangular wave SR shown in FIG. 4(B). This signal SR is applied to a trapezoidal wave generator STC, which then produces a trapezoid wave $S_T$. This trapezoid signal $S_T$ is applied to a rectifier RC, where it is full-wave rectified into a rectified wave $S_{TR}$ shown in FIG. 4(D). This rectified wave $S_{TR}$ is then applied to a dead zone circuit NFC, such as a typical Schmitt trigger circuit, thereby passes when it is at a threshold voltage $V_1$ or above as shown in FIG. 4(D), into a train of pulses P having a pulse width $\tau'$ (6-hour record mode) shown in FIG. 4(E). A sampling pulse P18 shown in FIG. 4(G) is produced at the trailing edge of the pulse P from a pulse generator PC1 and inverted by an inverter IV into a pulse P19 shown in FIG. 4(F). This pulse P19 closes a switch SW19 at its leading edge and opens it at its trailing edge. The pulse P18 is applied to a switch SW 18 closing it during non-duration of the pulse P19. A reset pulse P17 (shown in FIG. 4(H)) is produced at the trailing edge of the pulse P18 by a pulse generator PC2 and applied to a SW 17 to close it at its leading edge and open it at its trailing edge. The decoder 22 produces a control signal from a signal of three levels supplied thereto via its terminal $T_D$ and supplies them to the SW 23 and 24. If the input signal to the decoder is at ground level, the control signal makes the SW 23 and 24 nonconductive (or in the 6-hour record mode), if it is at the $V_{cc}/2$ level (source voltage level), the control signal makes the SW 23 in the on-state and the SW 24 in the off-state (4-hour record mode), and if it is at the $V_{cc}$ level, the control signal makes both SW 23 and 24 in the on-state (2-hour record mode). At this time, the voltage $V_R$ at a terminal 29 is changed in accordance with the on- or off- state of the SW 23 and 24. This voltage $V_R$ is applied via a buffer (not shown) to the current source 7 and then fed to one end of a variable resistor $R_V$. If the resultant resistance of resistors $R_V$ and R is assumed to be $R_o$, the output current $I_o$ from the current source 7 is given by $$I_o = V_R/R_o \tag{1}$$

At this time, the voltage, $V_{SAW}$ of a SAW signal shown in FIG. 4(I), after its trailing edge of the reset pulse P17, is given by $$V_{SAW} = \frac{I_o}{C} \cdot t = \frac{V_R}{CR_o} \cdot t \tag{2}$$

where C is the capacitance of a capacitor 20 and t is time. The actual sampling operation will be described below. After the reset pulse P17 falls off, the SAW signal rises up to the voltage expressed by the equation (2). Then, the pulse P18 is generated to close the SW18 and open the SW19. Thus, in the duration of the pulse P18, the charge current to the capacitor 20 is cut off, and as a result the SAW signal is kept at a constant level in the duration of the pulse P18 as shown in FIG. 4(I). Therefore, the voltage to be sampled is determined by the leading edge of the pulse P18. Just after sampling, the pulse P17 is produced to thereby discharge the capacitor 20 and thus the SAW signal is reduced to ground level. If the period of the FG signal is represented by $T_o$, and the pulse widths of pulses P18 and P17 by $t_{SP}$ and $t_R$, the sampling voltage $V_{SH}$ is given by $$V_{SH} = \frac{V_R}{CR_o}\left(\frac{T_o}{2} - t_{SP} - t_R\right) \quad (3)$$

The voltage $V_{SH}$ is shown in FIG. 4(J) and has a possibility of producing a step at the trailing edge of pulse P19. Thus, the voltage $V_{SH}$ is supplied via the low-pass filter LF to the error voltage amplifier 10 where it is compared with the reference voltage $E_R$. As described with reference to FIG. 1, the total gain of the error voltage amplifier 10 and motor drive means 11 is sufficiently high. Thus, even in the 2-hour or 6-hour record mode, the sampling voltage is determined to be $V_{cc}/2$. If the period of the FG signal in the 2-hour record mode is represented by $T_{02}$, the voltage at terminal 29 by $V_{R2}$, the pulse width of the pulse P18 by $t_{SP2}$, and the pulse width of the pulse P17 by $t_{R2}$, the following relationship is established from the equatation (3):

$$\frac{T_{02}}{2} = \frac{CR_o}{2} \cdot \frac{V_{cc}}{V_{R2}} + t_{SP2} + t_{R2} \quad (4)$$

If the period of the FG signal in the 6-hour record mode is represented by $T_{06}$, the voltage at terminal 29 by $V_{R6}$, the pulse width of pulse P18 by $t_{SP6}$ and the pulse width of pulse P17 by $t_{R6}$, the following relationship is satisfied:

$$\frac{T_{06}}{2} = \frac{CR_o}{2} \cdot \frac{V_{cc}}{V_{R6}} + t_{SP6} + t_{R6} \quad (5)$$

Here, $T_{02}$ and $T_{06}$ must satisfy the following equation:

$$T_{06} = 3T_{02} \quad (6)$$

The periods $t_{SP}$ and $t_R$ are reversely proportional to the current from the current source (the equation (1)) as described above. Thus, using constants $K_{SP}$ and $K_R$, the $t_{SP}$ and $t_R$ are expressed by $$t_{SP} = K_{SP}/I = \frac{K_{SP}R_o}{V_R} \quad (7)$$

$$t_R = K_R/I = \frac{K_R R_o}{V_R} \quad (8)$$

Thus, equations (4) and (5) are expanded as $$T_{02} = (\tfrac{1}{2}CR_oV_{cc} + K_{SP}R_o + K_R R_o)V_{R2} \quad (9)$$

$$T_{06} = (\tfrac{1}{2}CR_oV_{cc} + K_{SP}R_o + K_R R_o)V_{R6} \quad (10)$$

From equations (9) and (10), to satisfy the equation (6), it is necessary that, $$V_{R2} = 3V_{R6} \quad (11)$$

That is, if the voltage $V_R$ at terminal 29 is changed correctly, and the variable resistance $R_V$ is adjusted correctly, the control frequency can be changed correctly; or only the variable resistor $R_V$ need be used to achieve the above operations. For correct change of the voltage $V_R$, the resistors 25, 26, 27 and 28 can be formed as a hybrid IC and at this time adjusted in their values by trimming.

The constant current source 7 is formed of PNP transistors 55 and 56, and resistors 47 and 48. The PNP transistor 55 is connected in diode configuration, for temperature compensation so that the current flowing through the transistor 56 is not dependent on temperature but is kept constant. The trapezoidal wave generator STC comprises a PNP transistor 57 for a constant current source, PNP transistors 58 and 61 constituting a differential amplifier, NPN transistors 59 and 60 constituting a current Miller circuit, and a capacitor 30. The rectangular wave signal is applied to the transistors 58 and 61, making them alternately turn on and off. Thus, the constant current from the constant current source transistor 57 charges the capacitance 30 when the transistor 61 is conductive. When the transistor 61 is non-conductive, the transistor 60 is conductive, and thus the capacitor 30 is discharged to supply constant current. In this way, the rectangular wave signal $S_R$ is converted to the trapezoidal wave signal $S_T$ by the trapezoidal generator STC. The transistors 56 and 57 are connected together by a connection line $C_I$.

When the output current $I_o$ from the current source 7 is changed in accordance with the predetermined number of revolutions of the capstan motor 2, the amount of constant current from transistors 56 and 57 changes proportional thereto, so that the slopes of the trapezoidal wave from the trapezoidal wave generator STC can be made linear in accordance with the predetermined number of revolutions. Similarly, if the pulse widths of the pulses from the pulse generator circuits PC1 and PC2 are changed in reverse proportion to the number of revolutions, the ratio of the pulse width of each of the pulses P17, P18 and P19 to the period of the signal $S_{FG}$, for example, $t_{R6}/T_{06}$ can be made constant irrespective of the preset speed. The solid lines of the waveforms at (C), (D) and (E) in FIG. 4 are according to this invention, the dotted lines of the waveforms thereof are of the conventional example. In the conventional example, the pulse width is not changed in the 2-hour or 6-hour record mode. This pulse width is not changed in accordance with the predetermined number of revolutions and even though only the slope of the saw-tooth wave is changed, the saw-tooth wave cannot reach a correct voltage level $V_{SAW}$ (see FIG. 4(I)).

While the SW 23 and 24 are connected to ground as described above, the SW 23 and 24 may be connected to the source voltage, with the characteristic of the decoder 22 changed.

In accordance with this invention, since a number of speeds to be switched can be adjusted by a single operation by properly changing the voltage to be applied to the current source, the number of parts to be used and the time of adjustment can be greatly reduced. Moreover, in the sampling period, the level of the saw-tooth wave is made constant and the pulse widths of the sampling signal and reset signal are made in reverse proportion to the current from the current source, or the voltage to be changed so that the voltage to be changed approaches to a theoretical value with the factors of unnecessary scattering being removed. Therefore, it is easy to set values of the so-called discrete resistors which are mounted out of the IC substrate.

We claim:

1. A frequency-voltage converter for a motor speed control system comprising:
   frequency signal generating means for generating a frequency signal corresponding to the speed of a motor driven by a motor driving means;
   pulse generating means connected to receive the output of said frequency signal generating means for generating pulse signals in response to said frequency signal;

means connected to receive the output of said pulse generating means for generating a saw-tooth wave signal in response to said pulse signals and having a slope dependent upon an applied electric current;

sample-and-hold means connected to said saw-tooth wave signal generating means for sampling and holding a voltage of said saw-tooth wave signal;

means connected to said sample-and-hold means for comparing said sampled and held voltage of said saw-tooth wave signal with a reference voltage and for amplifying a difference between said sampled and held voltage and said reference voltage to output said amplified difference to said motor driving means;

a current source for supplying to said saw-tooth wave signal generating means an electric current which is dependent on the value of an applied supply voltage, said current source including a fixed resistor and a variable resistor to adjust the output current of said current source; and supply voltage changing means connected to said current source for supplying a voltage to said fixed and variable resistor and for changing the value of said supply voltage in accordance with an applied signbal indicating a desired speed of said motor.

2. A frequency-voltage converter according to claim 1, wherein said pulse generating means includes means for changing the width of the pulse of said generated pulse signals in accordance with said output current from said current source.

3. A frequency-voltage converter according to claim 1, wherein said supply voltage changing means a plurality of resistors and means for changing a condition of connection of said plurality of resistors to vary said supply voltage in accordance with said applied signal indicating said desired speed of said motor.

4. A frequency-voltage converter according to claim 3, wherein said plurality of resistors of said supply voltage changing means are fine adjusted as components of a hybrid integrated circuit.

5. A frequency-voltage converter according to claim 1, wherein said saw-tooth wave generating means, said current source, said pulse generating means and said sample-and-hold means are formed in an integrated circuit.

6. A frequency-voltage converter according to claim 3, wherein said supply voltage changing means is formed as an integrated circuit together with said sawtooth wave generating means, said current source, said pulse generating means, and said sample-and-hold means.

* * * * *